(12) United States Patent
Komuro et al.

(10) Patent No.: US 7,109,637 B2
(45) Date of Patent: Sep. 19, 2006

(54) THIN-FILM BULK ACOUSTIC OSCILLATOR AND METHOD OF MANUFACTURING SAME

(75) Inventors: Eiju Komuro, Tokyo (JP); Hisatoshi Saitou, Tokyo (JP); Yoshinari Yamashita, Tokyo (JP)

(73) Assignee: TDK Corporation, Tokyo (JP)

( * ) Notice: Subject to any disclaimer, the term of this patent is extended or adjusted under 35 U.S.C. 154(b) by 181 days.

(21) Appl. No.: 10/814,120

(22) Filed: Apr. 1, 2004

(65) Prior Publication Data

US 2005/0006984 A1 Jan. 13, 2005

(30) Foreign Application Priority Data

Jul. 9, 2003 (JP) ............................. 2003-194530

(51) Int. Cl.
*H01L 41/04* (2006.01)
*H03H 9/15* (2006.01)
(52) U.S. Cl. ...................................................... 310/320
(58) Field of Classification Search ................ 310/320, 310/324
See application file for complete search history.

(56) References Cited

U.S. PATENT DOCUMENTS

| | | | | |
|---|---|---|---|---|
| 5,605,490 A | * | 2/1997 | Laffey et al. ................. | 216/52 |
| 6,060,818 A | | 5/2000 | Ruby et al. .................. | 310/363 |
| 6,185,801 B1 | | 2/2001 | Kadota et al. ............. | 29/25.35 |
| 6,329,305 B1 | | 12/2001 | Bower et al. ................ | 438/800 |
| 6,944,922 B1 | * | 9/2005 | Shearer et al. ............. | 29/25.35 |
| 6,989,314 B1 | * | 1/2006 | Rayssac et al. ............. | 438/406 |
| 2002/0190814 A1 | * | 12/2002 | Yamada et al. ............. | 333/187 |

FOREIGN PATENT DOCUMENTS

| | | |
|---|---|---|
| JP | A 1-233816 | 9/1989 |
| JP | A 3-6113 | 1/1991 |
| JP | A 11-163655 | 6/1999 |
| JP | A 2000-69594 | 3/2000 |
| JP | EP 1124328 A1 | 8/2001 |
| JP | A 2001-274650 | 10/2001 |
| JP | A 2001-313535 | 11/2001 |
| JP | A 2002-151754 | 5/2002 |
| JP | A 2002-372974 | 12/2002 |

\* cited by examiner

*Primary Examiner*—Thomas M. Dougherty
(74) *Attorney, Agent, or Firm*—Oliff & Berridge, PLC

(57) ABSTRACT

A thin-film bulk acoustic oscillator comprises: a base; a barrier layer disposed on the base; a lower electrode disposed on the barrier layer; a piezoelectric thin film disposed on the lower electrode; and an upper electrode disposed on the piezoelectric thin film. The piezoelectric thin film includes a columnar crystal that extends in the direction intersecting the film surface. The top surface of the piezoelectric thin film is flattened by polishing so as to have a root mean square roughness of 2 nm or smaller.

2 Claims, 3 Drawing Sheets

THIN-FILM BULK ACOUSTIC OSCILLATOR AND METHOD OF MANUFACTURING SAME

BACKGROUND OF THE INVENTION

1. Field of the Invention

The present invention relates to a thin-film bulk acoustic oscillator incorporating a piezoelectric thin film and first and second electrodes disposed on both surfaces of the piezoelectric thin film, and to a method of manufacturing such a thin-film bulk acoustic oscillator.

2. Description of the Related Art

A reduction in size and an increase in usable frequency range have been sought for mobile telecommunications devices such as cellular phones that have been dramatically widespread. Accordingly, a reduction in size and an increase in usable frequency range have been desired for electronic components used in the mobile telecommunications devices, too.

Some mobile telecommunications devices comprise a duplexer for switching between a transmission signal path and a reception signal path, which allows a single antenna to be used for both transmission and reception. Such a duplexer comprises a transmission filter for allowing a transmission signal to pass therethrough and for interrupting a reception signal and a reception filter for allowing a reception signal to pass therethrough and for interrupting a transmission signal.

Surface acoustic wave filters have been recently used for the filters of some of the above-described duplexers. The surface acoustic wave filters have a feature that they are usable at frequencies up to 2 gigahertz and capable of being smaller in size compared to ceramic filters. However, if the future mobile telecommunications devices are designed to be used at frequencies of 2 gigaherz and higher, there are still many technical problems to be solved to make surface acoustic wave filters capable of being used at such high frequencies.

To solve these problems, attention has been given to devices called thin-film bulk acoustic oscillators. The thin-film bulk acoustic oscillator is the device utilizing bulk acoustic waves that are transmitted inside a piezoelectric thin-film in the direction of its thickness. A resonator incorporating the thin-film bulk acoustic oscillator is called a thin-film bulk acoustic resonator (that may be hereinafter referred to as FBAR), in particular. The FBAR allows variations in resonant frequency by changing the thickness of the piezoelectric thin film. It is estimated that the FBAR is capable of being used at frequencies of several gigaherz.

The characteristics of the thin-film bulk acoustic oscillator greatly depend on the thickness and quality of the piezoelectric thin film. A variety of methods have been thus proposed to improve the characteristics of the thin-film bulk acoustic oscillator. For example, the Published Unexamined Japanese Patent Application 2001-313535 discloses a technique for reducing the surface roughness of an electrode layer to be the base of the piezoelectric thin film. The Published Unexamined Japanese Patent Application 2002-372974 discloses a technique for reducing the surface roughness of the bottom surface of the piezoelectric thin film and thereby reducing the surface roughness of the top surface of the piezoelectric thin film.

One of the techniques relating to the surface acoustic wave elements is a technique for polishing the surface of a thin film formed to cover interdigital electrodes for reducing the occurrences of ripples, which is disclosed in the Published Unexamined Japanese Patent Application Heisei 1-233816 (1989).

The piezoelectric thin film of the thin-film bulk acoustic oscillator is made of zinc oxide (ZnO) or aluminum nitride (AlN), for example. The crystal of such a material may be column-shaped in some cases. To form the piezoelectric thin film of the thin-film bulk acoustic oscillator by using such a material, the piezoelectric thin film is formed by sputtering, for example, so that the crystal is formed into a column extending in the direction nearly vertical to the surface of the piezoelectric thin film to obtain an enhanced piezoelectric effect. The piezoelectric thin film thereby formed has an uneven top surface due to the columnar crystal especially when the thickness of the thin film is about 1 μm.

As mentioned above, the characteristics of the thin-film bulk acoustic oscillator greatly depend on the thickness of the piezoelectric thin film. In particular, the resonant frequency of the FBAR depends on the thickness of the piezoelectric thin film. Therefore, if the piezoelectric thin film has an uneven top surface as mentioned above, variations in thickness are created among portions of the piezoelectric thin film when seen microscopically. As a result, the characteristics of the thin-film bulk acoustic oscillator are reduced. The technique disclosed in the Published Unexamined Japanese Patent Application 2001-313535 is provided for reducing the surface roughness of the electrode layer to be the base of the piezoelectric thin film. The technique disclosed in the Published Unexamined Japanese Patent Application 2002-372974 is provided for reducing the surface roughness of the bottom surface of the piezoelectric thin film. However, it is difficult through either of these techniques to sufficiently reduce the projections and depressions of the top surface of the piezoelectric thin film that result from the column-shaped crystal of the material of the piezoelectric thin film. For example, the Published Unexamined Japanese Patent Application 2002-372974 discloses that the root mean square (RMS) roughness of the bottom surface of the piezoelectric thin film is 2.0 nanometers (nm) or smaller. However, when the crystal of the material of the piezoelectric thin film is columnar, it is difficult to control such that the root mean square roughness of the top surface of the piezoelectric thin film is 2.0 nm or smaller even if the root mean square roughness of the bottom surface of the piezoelectric thin film is controlled to be 2.0 nm or smaller.

OBJECT AND SUMMARY OF THE INVENTION

It is an object of the invention to provide a thin-film bulk acoustic oscillator having excellent characteristics and a method of manufacturing such a thin-film bulk acoustic oscillator.

A thin-film bulk acoustic oscillator of the invention comprises: a piezoelectric thin film that exhibits a piezoelectric property; a first electrode and a second electrode that are disposed on both surfaces of the piezoelectric thin film and apply an excitation voltage to the piezoelectric thin film; and a base. The first electrode, the piezoelectric thin film and the second electrode are stacked in this order on the base. According to the thin-film bulk acoustic oscillator of the invention, a surface of the piezoelectric thin film close to the second electrode has a root mean square (RMS) roughness of 2 nanometers or smaller. In the invention 'an object stacked on the base' not only means the object stacked directly on the base but also includes the cases in which the object is stacked on the base, another layer being provided between the base and the object.

According to the thin-film bulk acoustic oscillator of the invention, the surface of the piezoelectric thin film close to the second electrode has a root mean square roughness of 2 nanometers or smaller. Variations in thickness among portions of the piezoelectric thin film are thereby reduced. As a result, the characteristics of the thin-film bulk acoustic oscillator are improved.

According to the thin-film bulk acoustic oscillator of the invention, the piezoelectric thin film may be made of zinc oxide or aluminum nitride.

A method of manufacturing a thin-film bulk acoustic oscillator of the invention is provided for manufacturing the thin-film bulk acoustic oscillator comprising: a piezoelectric thin film that exhibits a piezoelectric property; a first electrode and a second electrode that are disposed on both surfaces of the piezoelectric thin film and apply an excitation voltage to the piezoelectric thin film; and a base; wherein the first electrode, the piezoelectric thin film and the second electrode are stacked in this order on the base. The method comprises the steps of: forming the first electrode on the base; forming the piezoelectric thin film on the first electrode; polishing a top surface of the piezoelectric thin film; and forming the second electrode on the top surface of the piezoelectric thin film polished.

According to the method of manufacturing the thin-film bulk acoustic oscillator of the invention, the top surface of the piezoelectric thin film is polished, so that variations in thickness among portions of the piezoelectric thin film are reduced. As a result, the characteristics of the thin-film bulk acoustic oscillator are improved.

According to the method of the invention, the top surface of the piezoelectric thin film may be polished to have a root mean square roughness of 2 nanometers or smaller in the step of polishing.

According to the method of the invention, the top surface of the piezoelectric thin film may be polished by chemical mechanical polishing in the step of polishing.

According to the method of the invention, the piezoelectric thin film may be made of zinc oxide or aluminum nitride.

Other and further objects, features and advantages of the invention will appear more fully from the following description.

DESCRIPTION OF PREFERRED EMBODIMENTS

Preferred embodiments of the invention will now be described in detail with reference to the accompanying drawings.

[First Embodiment]

Figure 1:
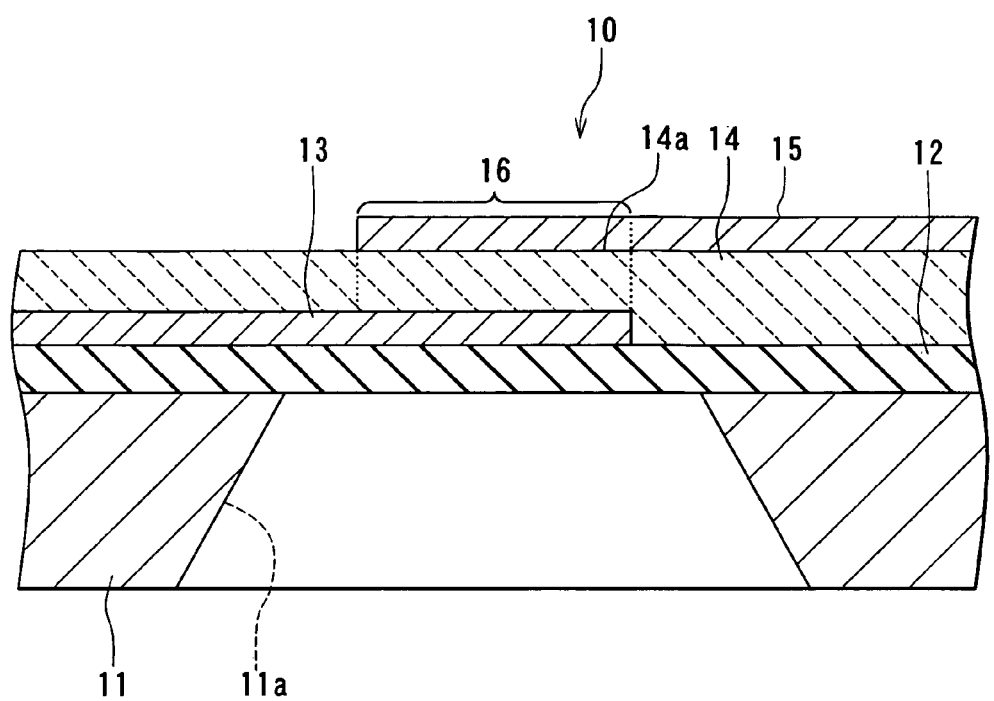
FIG. 1 is a cross-sectional view of a thin-film bulk acoustic oscillator of a first embodiment of the invention.

Reference is now made to FIG. 1 to describe the configuration of a thin-film bulk acoustic oscillator of a first embodiment of the invention. FIG. 1 is a cross-sectional view of the thin-film bulk acoustic oscillator of the first embodiment. In FIG. 1 the dimension taken in the vertical direction, that is, the thickness shown is greater than that taken in the horizontal direction.

The thin-film bulk acoustic oscillator 10 of the embodiment is particularly used as a resonator. The thin-film bulk acoustic oscillator 10 comprises: a base 11: a barrier layer 12 disposed on the base 11; a lower electrode 13 disposed on the barrier layer 12; a piezoelectric thin film 14 disposed on the lower electrode 13; and an upper electrode 15 disposed on the piezoelectric thin film 14. In the region of the thin-film bulk acoustic oscillator 10 indicated with numeral 16, the lower electrode 13, the piezoelectric thin film 14 and the upper electrode 15 are laid over one another. The lower electrode 13 and the upper electrode 15 apply an excitation voltage to a portion of the piezoelectric thin film 14 located in the region 16. The plane geometry of the region 16 may be rectangle-shaped. The base 11 has a cavity 11a located in a region corresponding to the region 16. The cavity 11a seen from above is rectangle-shaped. The base 11 may be made of a Si substrate.

The barrier layer 12 is an insulating layer that separates the base 11 from the lower electrode 13 so that the lower electrode 13 is disposed in the region corresponding to the cavity 11a of the base 11, too. The barrier layer 12 may be made of silicon nitride ($SiN_x$).

The piezoelectric thin film 14 is a thin film that exhibits a piezoelectric property. The piezoelectric thin film 14 may be made of zinc oxide (ZnO) or aluminum nitride (AlN). Each of the lower electrode 13 and the upper electrode 15 is mainly made of a metal and may be made of a chromium (Cr) layer on which a gold (Au) layer is stacked, for example.

As thus described, the thin-film bulk acoustic oscillator 10 of the embodiment comprises: the piezoelectric thin film 14 that exhibits a piezoelectric property; the lower electrode 13 and the upper electrode 15 that are disposed on both surfaces of the piezoelectric thin film 14 and apply an excitation voltage to the piezoelectric thin film 14; and the base 11. The lower electrode 13, the piezoelectric thin film 14, and the upper electrode 15 are stacked on the base 11 in this order, the barrier layer 12 being provided between the base 11 and the lower electrode 13. The piezoelectric thin film 14 includes a column-shaped crystal that extends in the direction intersecting the film surface or preferably in the direction nearly vertical to the film surface. The (top) surface of the piezoelectric thin film 14 closer to the upper electrode 15 is flattened by polishing as will be described later, so that the root mean square roughness thereof is 2 nm or smaller. The lower electrode 13 corresponds to the first electrode of the invention. The upper electrode 15 corresponds to the second electrode of the invention.

A high-frequency excitation voltage is applied to the lower electrode 13 and the upper electrode 15 of the thin-film bulk acoustic oscillator 10. This excitation voltage is applied to the portion of the piezoelectric thin film 14 located in the region 16. The portion of the piezoelectric thin film 14 in the region 16 is thereby excited, and bulk acoustic waves that are transmitted in the direction of thickness of the piezoelectric thin film 14 are generated. The portion of the piezoelectric thin film 14 in the region 16 resonates when the frequency of the excitation voltage is a specific resonant frequency.

A method of manufacturing the thin-film bulk acoustic oscillator 10 of the embodiment will now be described. In this method a Si substrate that is oriented to have a (100) surface, for example, is utilized as the base 11. A silicon nitride ($SiN_x$) film having a thickness of 200 nm, for example, is formed by chemical vapor deposition (CVD) on each of the top (front) surface and the bottom (back) surface of the base 11. The silicon nitride film formed on the top surface of the base 11 serves as the barrier layer 12 while the silicon nitride film formed on the bottom surface of the base 11 serves as a lower barrier layer (not shown).

Next, an opening (not shown) is formed in the lower barrier layer by photolithography and dry etching. The lower barrier layer is to be used as a mask for making the cavity 11a in the base 11 by etching.

Next, the lower electrode 13 is formed on the top surface of the barrier layer 12. The lower electrode 13 may be formed by lift-off as described below, wherein a Cr layer having a thickness of about 5 nm is formed and an Au layer having a thickness of about 100 nm is then formed. That is, a patterned resist having an opening formed in the region in which the lower electrode 13 is to be made is formed by photolithography on the top surface of the barrier layer 12. Next, the Cr layer having a thickness of about 5 nm is formed and the Au layer having a thickness of about 100 nm is then formed each by sputtering to cover the patterned resist. Next, the patterned resist is removed, and the Cr layer and the Au layer formed in the opening of the patterned resist are provided as the lower electrode 13.

Next, the piezoelectric thin film 14 is formed to cover the lower electrode 13. The piezoelectric thin film 14 is made of ZnO or AlN, for example, and formed by sputtering, for example. The thickness of the piezoelectric thin film 14 may be about 0.9 μm. The piezoelectric thin film 14 includes a column-shaped crystal that extends in the direction intersecting the film surface or preferably in the direction nearly vertical to the film surface. If the piezoelectric thin film 14 is made of ZnO or AlN, the piezoelectric thin film 14 is formed such that the C axis of the crystal thereof is directed to intersect the film surface, or preferably to be nearly vertical to the film surface.

Next, the top surface of the piezoelectric thin film 14 is flattened by mechanical polishing or chemical mechanical polishing (hereinafter referred to as CMP), for example. Through this polishing, the root mean square roughness of the top surface of the piezoelectric thin film 14 is made to be 2 nm or smaller.

Next, the upper electrode 15 is formed by lift-off, for example, on the top surface of the piezoelectric thin film 14, as will be described. That is, a patterned resist having an opening formed in the region in which the upper electrode 15 is to be made is formed by photolithography on the top surface of the piezoelectric thin film 14. Next, a Cr layer is formed and an Au layer is then formed each by sputtering to cover the patterned resist. Next, the patterned resist is removed, and the Cr layer and the Au layer formed in the opening of the patterned resist are provided as the upper electrode 15.

After the formation of the upper electrode 15 is completed, the base 11 is etched from the bottom (back) surface with KOH, using the lower barrier layer as a mask, to form the cavity 11a. Anisotropic etching is performed with KOH on the base 11 made of the Si substrate that is oriented to have the (100) surface. As a result, the base 11 is made to have the cavity 11a having a shape in which the width gradually increases toward the bottom.

According to the embodiment, as described so far, the piezoelectric thin film 14 is formed and then the top surface thereof is polished. The top surface of the piezoelectric thin film 14 as formed has projections and depressions that result from the columnar crystal of the piezoelectric thin film 14. According to the embodiment, the top surface of the piezoelectric thin film 14 is polished so as to be flattened. As a result, variations in thickness among portions of the piezoelectric thin film 14 are reduced. The characteristics of the thin-film bulk oscillator 10 are thereby improved.

The following is a description of the result of an experiment that shows the effect of polishing the top surface of the piezoelectric thin film 14, according to the embodiment. This experiment was performed to make a comparison between the frequency characteristic of impedance of a reference thin-film bulk acoustic oscillator and that of the thin-film bulk acoustic oscillator 10 of the embodiment of the invention. The reference thin-film bulk acoustic oscillator had a configuration similar to that of the thin-film bulk acoustic oscillator 10 of the embodiment except that the top surface of the piezoelectric thin film 14 was not polished. Here, the top surface of the piezoelectric thin film 14 of the reference thin-film bulk acoustic oscillator had a root mean square roughness of 23 nm. In the experiment the top surface of the piezoelectric thin film 14 of the thin-film bulk acoustic oscillator 10 of the embodiment had a root mean square roughness of 2 nm.

Figure 2:
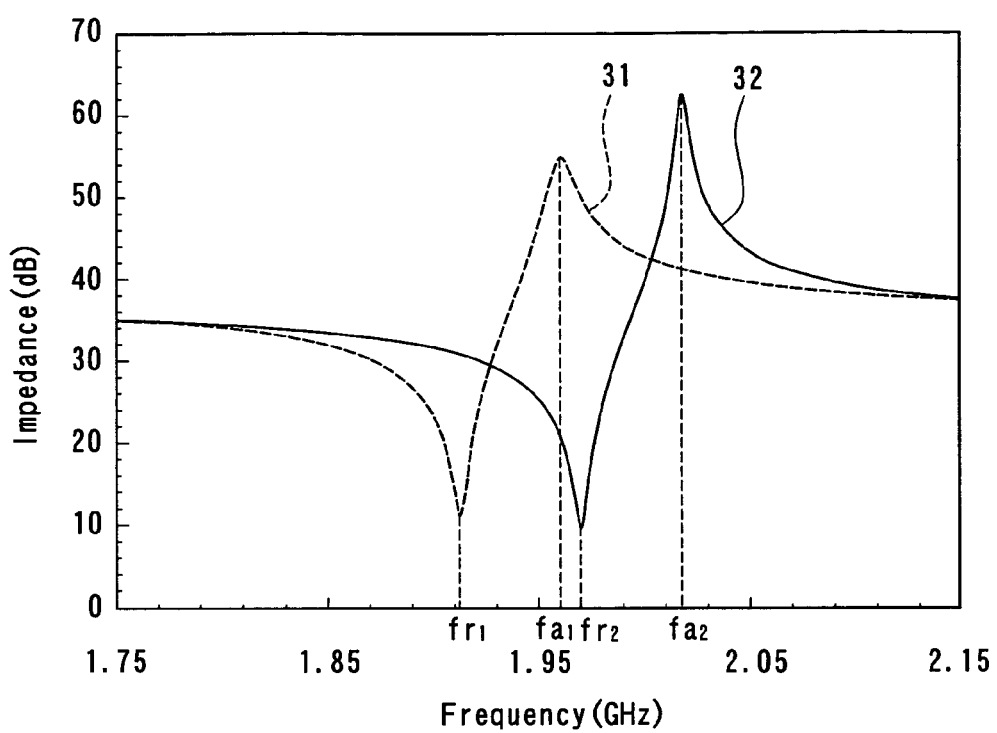
FIG. 2 is a plot showing a result of comparison made between the frequency characteristic of impedance of the thin-film bulk acoustic oscillator of the first embodiment of the invention and that of a reference thin-film bulk acoustic oscillator.

FIG. 2 shows the result of the above-mentioned experiment. In FIG. 2 the line indicated with numeral 31 represents the frequency characteristic of impedance of the reference thin-film bulk acoustic oscillator. The line indicated with numeral 32 represents the frequency characteristic of impedance of the thin-film bulk acoustic oscillator 10 of the embodiment. In FIG. 2 $f_{r1}$ indicates the resonant frequencies of the reference thin-film bulk acoustic oscillator, $f_{a1}$ indicates the antiresonant frequencies of the reference thin-film bulk acoustic oscillator, $f_{r2}$ indicates the resonant frequencies of the thin-film bulk acoustic oscillator 10 of the embodiment, and $f_{a2}$ indicates the antiresonant frequencies of the thin-film bulk acoustic oscillator 10 of the embodiment. In FIG. 2 the impedances are indicated in decibel (dB).

As shown in FIG. 2, the changes in the frequency characteristic of impedance of the thin-film bulk acoustic oscillator 10 of the embodiment are steeper, compared to the changes in the frequency characteristic of impedance of the reference thin-film bulk acoustic oscillator. In addition, the difference between the impedance at the resonant frequency and the impedance at the antiresonant frequency of the thin-film bulk acoustic oscillator 10 of the embodiment is greater than the difference between the impedance at the resonant frequency and the impedance at the antiresonant frequency of the reference thin-film bulk acoustic oscillator. These facts tell that the characteristic of the thin-film bulk acoustic oscillator 10 is improved by flattening the top surface of the piezoelectric thin film 14 by polishing. The resonant frequencies and antiresonant frequencies of the thin-film bulk acoustic oscillator 10 of the embodiment belong to higher frequencies, compared to the resonant frequencies and antiresonant frequencies of the reference thin-film bulk acoustic oscillator. This is because the thickness of the piezoelectric thin film 14 is reduced by polishing the top surface thereof.

Furthermore, according to the above-described experiment, the resonance characteristic of the thin-film bulk acoustic oscillator 10 is made much better by polishing the top surface of the piezoelectric thin film 14 so as to have a root mean square roughness of 2 nm, compared to the case in which the top surface of the piezoelectric thin film 14 is not polished. Therefore, it is preferred that the top surface of the piezoelectric thin film 14 is polished to have a root mean square roughness of 2 nm or smaller in the step of polishing the top surface of the piezoelectric thin film 14.

[Second Embodiment]

Figure 3:
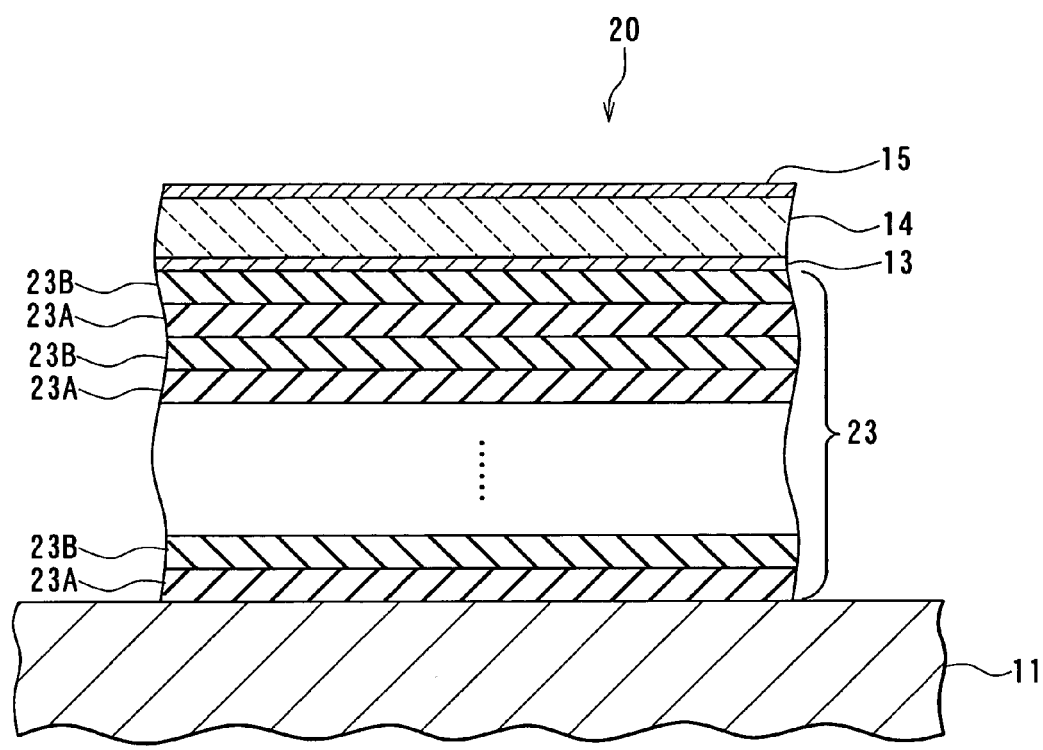
FIG. 3 is a cross-sectional view of a thin-film bulk acoustic oscillator of a second embodiment of the invention.

Reference is now made to FIG. 3 to describe a thin-film bulk acoustic oscillator and a method of manufacturing the same of a second embodiment of the invention. FIG. 3 is a cross-sectional view of the thin-film bulk acoustic oscillator of the embodiment. The thin-film bulk acoustic oscillator 20 of the embodiment is particularly used as a resonator. The thin-film bulk acoustic oscillator 20 comprises: the base 11; an acoustic multi-layer film 23 disposed on the base 11 and made up of a plurality of dielectric layers having different acoustic impedances; the lower electrode 13 disposed on the acoustic multi-layer film 23; the piezoelectric thin film 14 disposed on the lower electrode 13; and the upper electrode 15 disposed on the piezoelectric thin film 14. In such a manner, according to the second embodiment, the lower electrode 13, the piezoelectric thin film 14 and the upper electrode 15 are stacked in this order on the base 11, the acoustic multi-layer film 23 being disposed between the base 11 and the lower electrode 13. In the second embodiment the base 11 has no cavity 11a.

The acoustic multi-layer film 23 is made up of first dielectric layers 23A made of a dielectric material having a high acoustic impedance and second dielectric layers 23B made of a dielectric material having a low acoustic impedance, the first dielectric layers 23A and the second dielectric layers 23B being alternately stacked. The first dielectric layers 23A may be made of any of AlN, ZnO and $Al_2O_3$, for example. The second dielectric layers 23B may be made of $SiO_2$, for example.

The acoustic multi-layer film 23 has a function of confining the elastic waves generated by the piezoelectric thin film 14 inside the piezoelectric thin film 14. Each of the dielectric layers 23A and 23B has a thickness that is fixed around a quarter of the wavelength that corresponds to the resonant frequency inside each of the dielectric layers 23A and 23B.

The method of manufacturing the thin-film bulk acoustic oscillator of the second embodiment comprises the steps of forming the acoustic multi-layer film 23, the lower electrode 13, the piezoelectric thin film 14 and the upper electrode 15 in this order on the base 11. The step of forming the acoustic multi-layer film 23 includes the step of forming the first dielectric layers 23A and the second dielectric layers 23B alternately. The methods of forming the lower electrode 13, the piezoelectric thin film 14 and the upper electrode 15 are similar to those of the first embodiment.

According to the second embodiment, after the piezoelectric thin film 14 is formed, the top surface thereof is polished by mechanical polishing or CMP, for example, as in the first embodiment. Through this polishing, the top surface of the piezoelectric thin film 14 is made to have a root mean square roughness of 2 nm or smaller.

As in the first embodiment, a comparison of the frequency characteristics of impedances was made between the thin-film bulk acoustic oscillator 20 of the second embodiment and a reference thin-film bulk acoustic oscillator having a configuration the same as that of the thin-film bulk acoustic oscillator 20 except that the top surface of the piezoelectric thin film 14 is not polished. Although not shown, the result was similar to that of the result shown in FIG. 2.

The remainder of configuration, function and effects of the second embodiment are similar to those of the first embodiment.

The present invention is not limited to the foregoing embodiments but may be practiced in still other ways. For example, the piezoelectric thin film 14 may be made of any material other than ZnO and AlN.

According to the thin-film bulk acoustic oscillator of the invention thus described, the surface of the piezoelectric thin film close to the second electrode has a root mean square roughness of 2 nm or smaller. As a result, the thin-film bulk acoustic oscillator having excellent characteristics is achieved.

According to the method of manufacturing the thin-film bulk acoustic oscillator of the invention, the top surface of the piezoelectric thin film is polished. The thin-film bulk acoustic oscillator having excellent characteristics is thereby achieved.

Obviously many modifications and variations of the present invention are possible in the light of the above teachings. It is therefore to be understood that within the scope of the appended claims the invention may be practiced otherwise than as specifically described.

What is claimed is:

1. A thin-film bulk acoustic oscillator comprising:
   a piezoelectric thin film that exhibits a piezoelectric property;
   a first electrode and a second electrode that are disposed on both surfaces of the piezoelectric thin film and apply an excitation voltage to the piezoelectric thin film; and
   a base; wherein:
   the first electrode, the piezoelectric thin film and the second electrode are stacked in this order on the base; and
   the piezoelectric thin film has a surface on which the second electrode is disposed, the surface being polished and having a root mean square roughness of 2 nanometers or smaller.

2. The thin-film bulk acoustic oscillator according to claim 1, wherein the piezoelectric thin film is made of zinc oxide or aluminum nitride.

* * * * *